(12) United States Patent
Joseph et al.

(10) Patent No.: US 11,054,435 B2
(45) Date of Patent: Jul. 6, 2021

(54) METHOD AND DEVICE FOR PROCESSING A SIGNAL PRODUCED BY A SENSOR FOR DETECTING THE ROTATION OF A ROTATING TARGET

(71) Applicants: CONTINENTAL AUTOMOTIVE FRANCE, Toulouse (FR);
CONTINENTAL AUTOMOTIVE GMBH, Hannover (DE)

(72) Inventors: Fabien Joseph, Castanet Tolosan (FR); Valerie Gouzenne Coutier, Tournefeuille (FR)

(73) Assignees: CONTINENTAL AUTOMOTIIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 648 days.

(21) Appl. No.: 15/552,859

(22) PCT Filed: Feb. 22, 2016

(86) PCT No.: PCT/EP2016/000306
§ 371 (c)(1),
(2) Date: Aug. 23, 2017

(87) PCT Pub. No.: WO2016/134841
PCT Pub. Date: Sep. 1, 2016

(65) Prior Publication Data
US 2018/0031594 A1    Feb. 1, 2018

(30) Foreign Application Priority Data

Feb. 24, 2015  (FR) ...................................... 1551551

(51) Int. Cl.
*G01P 3/44*    (2006.01)
*G01P 13/04*    (2006.01)
(Continued)

(52) U.S. Cl.
CPC .............. *G01P 3/44* (2013.01); *F02D 41/009* (2013.01); *F02D 41/28* (2013.01); *G01D 5/245* (2013.01);
(Continued)

(58) Field of Classification Search
None
See application file for complete search history.

(56) References Cited

U.S. PATENT DOCUMENTS 4,563,995 A * 1/1986 Locher .................... F02D 41/28
123/488
5,130,536 A * 7/1992 Sato ..................... G01D 5/2457
250/231.17
(Continued)

FOREIGN PATENT DOCUMENTS

CN          1536337         10/2004
CN        101701968          5/2010
(Continued)

OTHER PUBLICATIONS

Machine Translation for FR2942851 (Year: 2009).*
(Continued)

*Primary Examiner* — Catherine T. Rastovski
*Assistant Examiner* — Leonard S Liang
(74) *Attorney, Agent, or Firm* — Nixon & Vanderhye

(57) ABSTRACT

Disclosed is a method for processing a primary signal produced by a sensor detecting the rotation of a rotating target. The primary signal includes pulses having, for a given speed of rotation of the target, a first positive voltage level for rotation in a first determined direction or a second positive voltage level for the opposite direction. A first secondary signal is generated by comparing the primary signal to a first determined voltage threshold between the first and second voltages. A second secondary signal is
(Continued)

generated by comparing the primary signal to a second determined voltage threshold between the second voltage level and zero. A determined delay is introduced in the second secondary signal. A determined time threshold is compared to the duration between an active edge of the second secondary signal and the last preceding active edge of the first secondary signal, indicating direction.

20 Claims, 3 Drawing Sheets

(51) Int. Cl.
- G01D 5/245 (2006.01)
- F02D 41/00 (2006.01)
- F02D 41/28 (2006.01)
- H03K 5/26 (2006.01)
- G01M 15/06 (2006.01)

(52) U.S. Cl.
CPC ............ G01D 5/2457 (2013.01); G01P 13/04 (2013.01); G01P 13/045 (2013.01); F02D 41/0097 (2013.01); F02D 2041/0095 (2013.01); F02D 2041/286 (2013.01); F02D 2250/06 (2013.01); G01M 15/06 (2013.01); H03K 5/26 (2013.01)

(56) References Cited

U.S. PATENT DOCUMENTS

| | | | |
|---|---|---|---|
| 5,212,380 A * | 5/1993 | Sato ................ | G01D 5/2457 123/613 |
| 5,471,054 A * | 11/1995 | Watanabe .......... | G01D 5/24452 250/231.13 |
| 6,147,486 A * | 11/2000 | Koss .................. | F02D 41/0097 324/166 |
| 6,147,487 A * | 11/2000 | Sugitani ............ | G01D 5/145 324/207.21 |
| 6,208,131 B1 | 3/2001 | Cebis et al. | |
| 6,578,550 B1 | 6/2003 | Rupp et al. | |
| 6,784,658 B2 | 8/2004 | Kawagoe et al. | |
| 6,830,015 B2 * | 12/2004 | Venturoli ............ | F02P 5/1504 123/41 E |
| 7,138,793 B1 * | 11/2006 | Bailey ................ | G01D 5/14 324/207.12 |
| 7,345,468 B2 * | 3/2008 | Okada ................ | G01P 13/045 324/165 |
| 7,444,262 B2 * | 10/2008 | Hashizume ........ | F02D 41/009 702/145 |
| 8,818,685 B2 | 8/2014 | Shimizu | |
| 9,133,776 B2 * | 9/2015 | Shimizu ............ | F02D 13/0238 |
| 10,001,503 B2 * | 6/2018 | Ohmi ................ | G01P 3/481 |
| 10,191,075 B2 * | 1/2019 | Shin .................. | G01P 13/04 |
| 2002/0030487 A1 * | 3/2002 | Shinjo .............. | G01D 5/147 324/207.21 |
| 2002/0078937 A1 * | 6/2002 | Kiessling .......... | G01P 13/045 123/603 |
| 2002/0196052 A1 | 12/2002 | Furuya | |
| 2004/0196257 A1 | 10/2004 | Sato et al. | |
| 2005/0120782 A1 * | 6/2005 | Kishibata .......... | F02D 41/009 73/114.26 |
| 2005/0194964 A1 * | 9/2005 | Okada ................ | G01P 13/045 324/165 |
| 2005/0206371 A1 * | 9/2005 | Tsukamoto ........ | G01D 5/145 324/207.21 |
| 2006/0161273 A1 * | 7/2006 | Bizard .............. | G01P 13/045 700/29 |
| 2006/0190161 A1 * | 8/2006 | Nakamura ........ | B60K 6/24 701/114 |
| 2007/0182405 A1 * | 8/2007 | Yokotani .......... | G01D 5/2451 324/207.25 |
| 2008/0010037 A1 * | 1/2008 | Hashizume ...... | G01P 3/489 702/151 |
| 2010/0013467 A1 * | 1/2010 | Hara ................ | G01D 5/24476 324/207.25 |
| 2010/0026279 A1 | 2/2010 | Vig et al. | |
| 2010/0057392 A1 | 3/2010 | York | |
| 2010/0106452 A1 | 4/2010 | Tatenuma et al. | |
| 2010/0225308 A1 * | 9/2010 | Kurumado ........ | G01D 5/2451 324/207.25 |
| 2010/0231202 A1 | 9/2010 | Scheller et al. | |
| 2010/0241302 A1 * | 9/2010 | Shimizu ............ | F02D 41/009 701/31.4 |
| 2010/0313837 A1 | 12/2010 | Fujioka | |
| 2011/0246133 A1 * | 10/2011 | Harada ............ | G01D 5/145 702/151 |
| 2011/0295483 A1 | 12/2011 | Ma et al. | |
| 2013/0241570 A1 | 9/2013 | Okamoto et al. | |
| 2013/0245914 A1 * | 9/2013 | Shimizu ............ | F02D 45/00 701/102 |
| 2015/0300917 A1 | 10/2015 | Hou | |
| 2015/0315988 A1 | 11/2015 | Hou | |
| 2016/0231346 A1 * | 8/2016 | Ohmi ................ | G01P 3/481 |
| 2018/0080395 A1 * | 3/2018 | Gouzenne Coutier ...... F02D 41/009 | |
| 2018/0292236 A1 * | 10/2018 | Tatenuma .......... | G01D 5/2451 |

FOREIGN PATENT DOCUMENTS

| | | | |
|---|---|---|---|
| CN | 101819080 | 9/2010 | |
| CN | 102007378 | 4/2011 | |
| CN | 102112883 | 6/2011 | |
| CN | 102165170 | 8/2011 | |
| CN | 102312743 | 1/2012 | |
| CN | 102388316 | 3/2012 | |
| CN | 202394685 | 8/2012 | |
| CN | 103308092 | 9/2013 | |
| CN | 103222020 | 12/2015 | |
| EP | 1114324 | 7/2001 | |
| FR | 2942851 A1 * | 9/2010 | ........... F02D 41/009 |
| FR | 2942852 A1 * | 9/2010 | ........... F02D 41/009 |
| JP | 58172512 A * | 10/1983 | |
| JP | 03264875 A * | 11/1991 | |
| JP | 2000-500863 | 1/2000 | |
| JP | 20050233622 A | 9/2005 | |
| JP | 2007-212351 | 8/2007 | |
| JP | 2010242742 A * | 10/2010 | |
| JP | 2012062901 A * | 3/2012 | |
| JP | 2012145416 A * | 8/2012 | |
| WO | 2014/082730 A1 | 6/2014 | |
| WO | 2014/082731 A1 | 6/2014 | |

OTHER PUBLICATIONS

Machine Translation for FR2942852 (Year: 2009).*
International Search Report, dated Oct. 5, 2016, from corresponding PCT/EP2016/000306 application.
Office Action issued in Indian Patent Application No. 201717029351 dated Mar. 19, 2021.

* cited by examiner

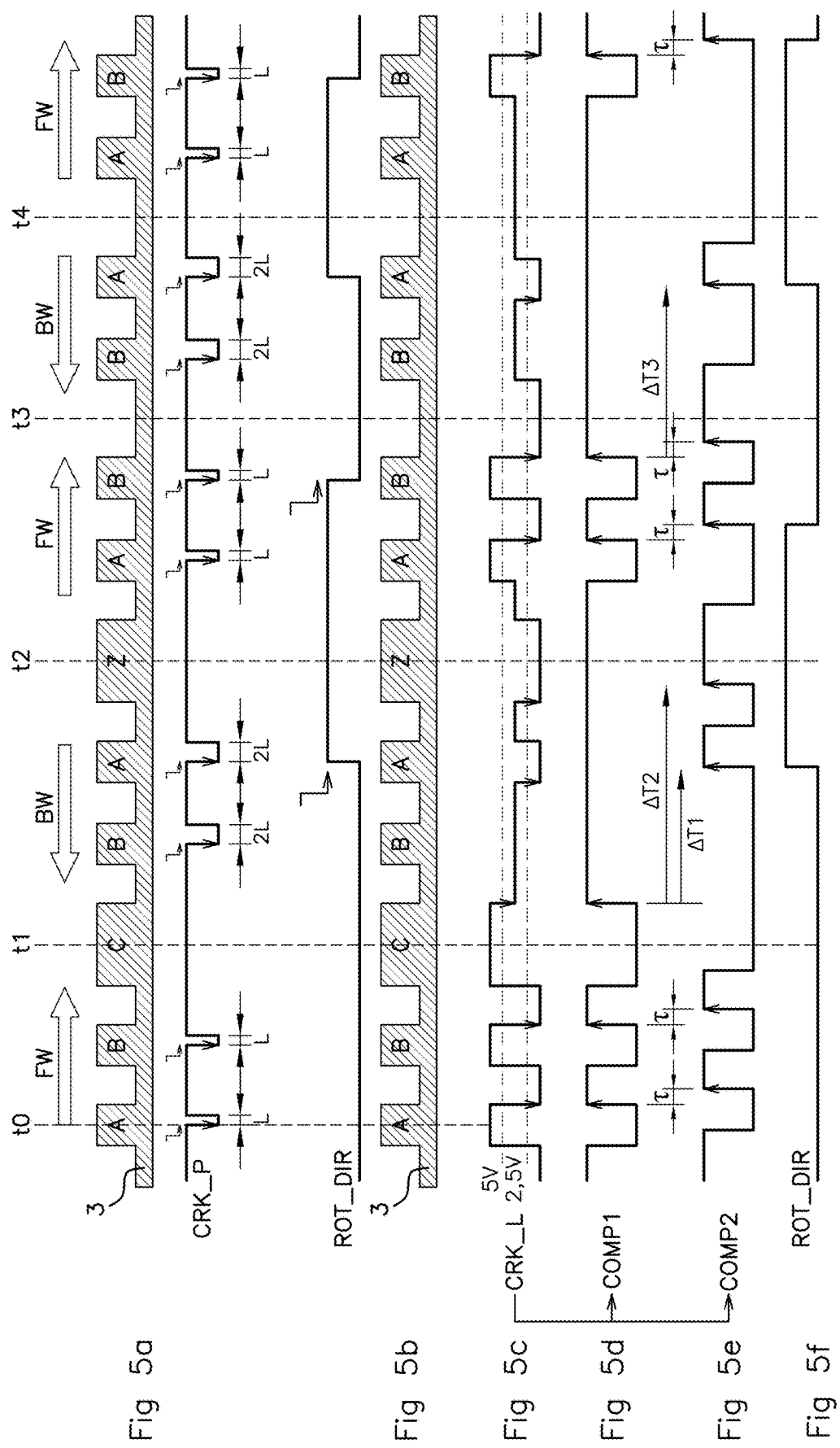

METHOD AND DEVICE FOR PROCESSING A SIGNAL PRODUCED BY A SENSOR FOR DETECTING THE ROTATION OF A ROTATING TARGET

The present invention pertains in a general manner to techniques for synchronization of an internal combustion engine, and especially to the processing of a signal of a sensor for detecting the angular position of the crankshaft of such an engine.

It concerns more particularly a method and a device for processing a signal produced by a sensor for detecting the rotation of a rotating target, in order to deduce from that the direction of rotation of the target.

The invention finds applications, in particular, in the field of automobiles. It may be implemented, for example, in an engine control computer, such as an injection and/or ignition controller.

BACKGROUND OF THE INVENTION

In order to enable the synchronization of the injection and/or the ignition of an internal combustion engine, the engine crankshaft may be equipped with a rotating target cooperating with a fixed sensor associated with processing electronics of the signal of the sensor. These electronics may comprise hardware and/or software elements. They are adapted and configured to determine precisely the angular position of the crankshaft, and thus the position of the pistons of the engine, based on the signal of the sensor.

The rotating target is for example a toothed wheel, joined in rotation with the crankshaft. Such a target contains a large number of teeth, generally thirty six or sixty teeth, not counting one or two missing teeth in order to define an angular reference zone on the target.

More particularly, the angular position of the engine is determined by the processing electronics by counting the number of teeth of the target that are "seen" by the sensor since its last passage through the angular reference zone in front of the sensor. From an electrical standpoint, the passing by a flank of a tooth of the target in front of the sensor translates into an edge of the sensor signal, namely, a rising edge or a falling edge depending on the arrangement and the technology of the sensor. Each of these edges corresponds to an increment of the angular position of the crankshaft counted by the processing electronics. This angular increment is equal to 10 degrees for a target with 36 teeth, or 6 degrees for a target with 60 teeth, for example.

In order to restart the engine efficiently after a stop, it is important to know the precise position of stopping of the engine. The efficiency in question here is evaluated in particular in terms of the speed of synchronization of the injection and the ignition, which governs the fuel consumption and the emission of $CO_2$. Likewise, it is evaluated in terms of engine restarting flexibility, that is, low level of vibrations and noise perceptible by the user. These efficiency criteria are particularly important for vehicles equipped with a so-called "stop and start" function, designed to reduce the fuel consumption in urban driving while enabling immediate and quiet engine restarting.

While in theory an engine of a vehicle always turns in the same direction, it may happen that, during the stopping of the engine, the crankshaft oscillates slightly about a position of equilibrium corresponding to the engine stopping position. This is due to opposing phenomena of engine inertia, on the one hand, and engine braking, on the other. Now, the passing of a tooth of the target in front of the sensor in the direction opposite the normal direction is seen, from the viewpoint of the sensor, in the same way as a passage in the normal direction, except it is the opposite flank of the tooth which causes the sensor to respond. This means that, if no measure for detecting the direction of rotation is adopted, the passing of a tooth in front of the sensor in the opposite direction to the normal direction will result in a further counting of an angular increment, whereas in reality it should result in a subtracting of said increment. The angular error is then equal to twice the value of the angular increment, that is, by 20 degrees or by 12 degrees, respectively, in the aforementioned examples.

In order to determine precisely the engine stopping position, bidirectional sensors are used. Such a sensor is able not only to detect the passage of a flank of a tooth of the target in front of the sensor, but also to determine the direction of rotation of that target. A strategy integrated in the electronic signal processing of the sensor then makes use of the information on the direction of rotation of the target in order to determine precisely the position of the engine during its stopping.

A bidirectional sensor of known type, such as the one in document JP 2005 233622, provides square-wave signals having segments at high level, alternating with segments at low level. The duration of the segments at high level, for example, depends on the direction of rotation of the target. Such a sensor is called a "voltage pulse sensor". In fact, it is possible for the electronic signal processing of the sensor to determine, for each new edge of the sensor signal, the direction of passage of the corresponding tooth flank in front of the sensor, and thus to count or subtract the corresponding angular increment.

However, there are also bidirectional sensors operating by a different principle. With this other type of sensor, the direction of rotation of the target is given in the signal by causing a variation in the voltage corresponding for example to the high level and/or to the low level of the signal of the sensor. Such a "voltage level sensor" is likewise described in the cited document JP 2005 233622, with reference to FIG. 6 of that document. As shown in this figure, the sensor signal in question has three different voltage levels, in particular depending on the direction of rotation of the target being tracked.

Of course, the electronic signal processing of the sensor is adapted to the type of sensor used between the two aforementioned types, and is not interchangeable between one type of sensor and the other.

Therefore, for an equipment maker having an electronic processing corresponding to one of the two types of sensors above for a given application, the use of a sensor of the other type requires the development of new electronics. Now, the development and validation of such electronics takes time and is very costly. In particular, the software elements which need to be modified on account of the substitution of one type of sensor for the other may require a requalification of a larger software assemblage within the computer dedicated to the particular application.

SUMMARY OF THE INVENTION

The invention aims at eliminating or at least mitigating some or all of the aforementioned drawbacks of the prior art. In particular, the invention makes it possible to reuse software elements of an electronic signal processing of a voltage pulse sensor in the event of using a voltage level sensor.

For this purpose, a first aspect of the invention proposes a method for processing a primary signal produced by a sensor for detecting the rotation of a rotating target of the voltage level type, said primary signal comprising pulses having, for a given speed of rotation of the target, a first positive voltage level when the target is turning in a first determined direction of rotation or a second positive voltage level, different from said first voltage level, when the target is turning in a second direction of rotation opposite said first direction of rotation. The method involves:

- the generating of a first secondary signal by comparing the primary signal to a first determined voltage threshold between the first voltage level and the second voltage level;
- the generating of a second secondary signal by comparing the primary signal to a second determined voltage threshold between the second voltage level and zero voltage;
- the intentional introduction of a determined delay in the second secondary signal with respect to the first secondary signal; and
- the comparing to a determined time threshold of the duration between an active edge of the second secondary signal and the last active edge of the first secondary signal preceding said active edge of the second secondary signal, in order to deduce from that the direction of rotation of the target.

In one embodiment, the method may further involve the generating of an angular clock signal translating the speed of rotation of the target based on the second secondary signal. In fact, this secondary signal carries the information corresponding substantially to all the primary signal edges, that is, all the flanks of the teeth of the target which are detected by the sensor of rotation.

The intentional introduction of a delay in the second secondary signal with respect to the first secondary signal ensures that an edge of the second secondary signal always occurs after a corresponding edge of the first secondary signal for an edge of the primary signal extending from the first positive voltage level to zero voltage, regardless of any fluctuation ("jitter") of the signals.

In embodiments of the method, the time threshold used in the comparison step may be substantially equal to the duration of the delay introduced in the second secondary signal with respect to the first secondary signal.

In embodiments of the comparison step:

- if the duration between an active edge of the second secondary signal and the last active edge of the first secondary signal preceding said active edge of the second secondary signal is substantially equal to the time threshold, then it is determined that the target is turning in a normal direction of rotation; whereas
- if on the contrary the duration between an active edge of the second secondary signal and the last active edge of the first secondary signal preceding said active edge of the second secondary signal is greater than the time threshold, then it is determined that the target is turning in a direction of rotation opposite the normal direction of rotation.

For example, in the comparison step, there may be generated a signal for detection of the direction of rotation of the target having a first logic level when it is determined that the target is turning in a normal direction of rotation and a second logic level, different from said first logic level, when it is determined that the target is turning in a direction of rotation opposite the normal direction of rotation.

Preferably, the generating of the first secondary signal, the generating of the second secondary signal, and the intentional introduction of the delay in the second secondary signal with respect to the first secondary signal are done through hardware, whereas the comparing to the time threshold of the duration between an active edge of the second secondary signal and the last active edge of the first secondary signal preceding said active edge of the second secondary signal is done through software.

A second aspect of the invention pertains to an electronic device comprising means of implementing each of the steps of a processing method according to the first aspect above.

According to a third aspect, the invention also concerns a system for management of an internal combustion engine, comprising at least one rotating target integrated in rotation with a crankshaft or a camshaft of the engine, as well as a bidirectional sensor of the voltage level type and an electronic device according to the second aspect above.

BRIEF DESCRIPTION OF THE DRAWINGS

Other characteristics and advantages of the invention will further appear upon perusal of the following description. This is merely illustrative and should be read in view of the appended drawings, in which:

FIGS. 5a-5f are chronograms of various signals illustrating the functioning of the device of FIG. 1.

An internal combustion engine, such as one for an automobile, comprises at least one movable piston designed to cause a change in the volume of a combustion chamber. The admission and the exhausting of gas in the combustion chambers are most often done with the help of valves controlled by at least one camshaft. The energy developed in the combustion chambers by the combustion of a fuel within an oxidizer is transmitted by each piston to an engine shaft, known as the crankshaft.

Embodiments of the invention are described below in their nonlimiting application to the synchronization of an internal combustion engine. However, the invention is not limited to this example. It may also be applied to the processing of a signal produced by a sensor for detecting the rotation of a shaft of a gear box shaft of an automobile, for example, or any rotating shaft. In general, in fact, embodiments of the invention may be implemented in various applications in which it is necessary to determine the angular position of a rotating target, in order to deduce from that the direction of rotation of the target.

The synchronization of an internal combustion engine consists in identifying with precision the position of the moving parts (piston, crankshaft, camshaft, etc.) as well as the stroke in the engine cycle (whether this is a 2-stroke or a 4-stroke engine). This allows the onboard electronics to control the functioning of the engine, especially as regards the injection of the fuel or the fuel mixture and as regards the ignition (for controlled ignition engines), with the accuracy and precision needed to obtain an optimal functioning.

Synchronization methods implement algorithms able to determine the position of the engine as a function of the angular position of the crankshaft and/or the camshaft of the engine, detected by sensors installed in the engine. These sensors cooperate with rotating targets which are integrated in rotation with the crankshaft and the camshaft, respectively, such as toothed wheels.

In the following, we shall consider more particularly the example of the processing of a signal from a sensor for detecting the rotation of the crankshaft of an engine. This example, of course, is not understood to be limiting. The invention may also be applied, in particular, to the processing of a signal from a sensor of rotation of the camshaft of an engine, or a shaft of a gearbox, as indicated above.

Figure 1:
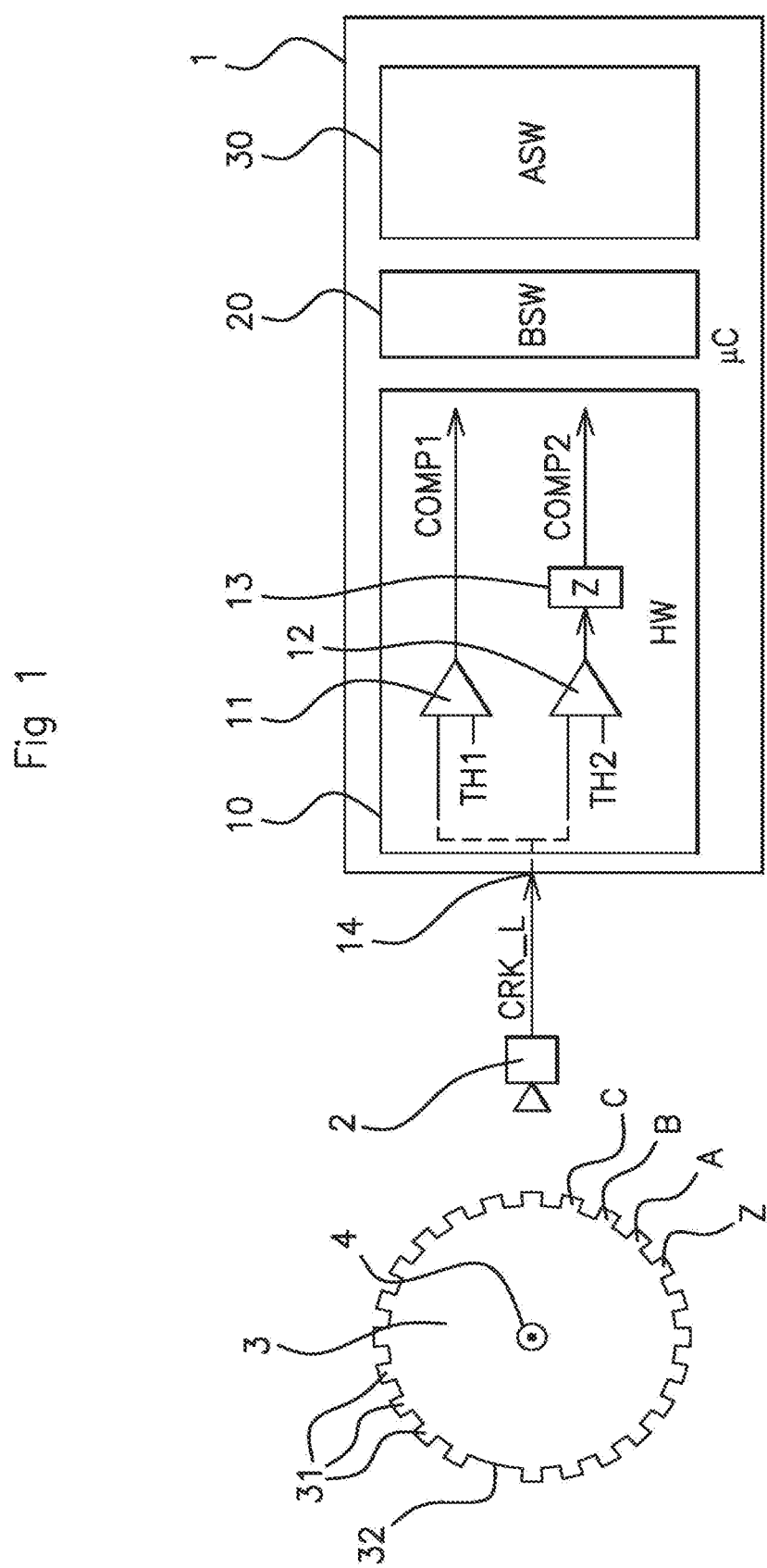
FIG. 1 is a functional diagram showing the arrangement of a rotating target, a sensor for detecting the rotation of the rotating target, and an electronic processing unit of the sensor signal, comprising a first comparator and a second comparator according to embodiments.

Referring to the functional diagram of FIG. 1, we shall consider an example of the application of the invention to a controller of injection and/or ignition of an internal combustion engine of an automobile.

The controller 1 may be realized in the form of a microcontroller (µC), which may be an application specific integrated circuit (ASIC), a system-on-chip (SoC), a programmable logic circuit or field programmable gate array (FPGA), etc. However, the invention is not limited to these examples, the controller able to be part of more complex equipment, comprising for example an arrangement of several integrated circuits including, computers, memories, peripherals, etc.

The microcontroller 1 comprises a hardware portion or hardware module 10 and a software portion with a first software module 20 and a second software module 30.

The hardware portion 11 comprises the hardware (HW) elements of the microcontroller, such as analog-digital converters, drivers, input/output filters, etc.

The first software module 12 comprises for example the software elements which depend on the microcontroller used for the particular application. These software elements form what is called the basic software (BSW).

The second software module 30 comprises for example the software elements which depend only on the particular application, and not the microcontroller used, so that they may be embarked on any given microcontroller. These software elements form what is called the application software (ASW).

The advantage of this carving up lies in the possibility of reusing the code (software) of the ASW module without modification in different applications using any given microcontroller, or any other electronic circuit, within an electronic management system of an internal combustion engine.

In the ASW module there are included software components which are designed to determine the angular position of the engine, as well as software components designed to generate an angular clock signal as a function of its speed of rotation. The first elements above can implement a counter. The second elements can implement a digital phase locked loop (DPLL). This information allows other software components to provide for the synchronization of the engine control in the different phases of its functioning.

The device according to the embodiments of the invention may be realized within this microcontroller, as shall now be described.

The microcontroller 10 comprises for this purpose an input 14 to receive a sensor signal CRK_L, or primary signal, provided by a sensor of rotation 2. In the embodiment represented, the sensor 2 is a bidirectional rotation sensor of the voltage level type.

The sensor 2 is for example positioned in a fixed manner near a rotating target 3, such as a toothed wheel, with which it cooperates to produce the signal CRK_L. The term "toothed wheel" should be understood in its most general meaning, that is, a wheel comprising structural elements allowing a sensor to reference the rotation of the wheel on a definite angular sector. The nature and the arrangement of these structural elements may vary. It may have geometrical shapes such as teeth in the proper sense, magnetic elements such as magnetic poles, optical elements or those referenceable by an optoelectronic device, etc.

For simplicity, in the example considered here the toothed wheel 3 comprises twenty six teeth 31 regularly spaced around the periphery of the wheel, except in the area of a reference zone 32 where at least one tooth is missing. This example is chosen simply because it allows referencing of the succession of teeth by the twenty six letters of the alphabet, namely the series A, B, C . . . , Z. With this example, the angular increment is around 13 degrees. In practice, however, and as explained in the introduction, a target classically used has instead 36 or 60 teeth (not counting the fact that one or more teeth are missing in the reference zone), giving an angular increment of 10 or 6 degrees, respectively.

The toothed wheel 3 is integrated in rotation with a movable shaft 4, namely, the crankshaft of the engine in the example considered here.

The microcontroller 10 comprises first elements, notably software elements, designed to function based on a sensor signal coming from a bidirectional rotation sensor of the voltage pulse type. However, supplemental elements, notably hardware elements, are added to the device to allow said first elements to function based on a sensor signal coming from a bidirectional rotation sensor of the voltage level type.

Before continuing with the description of embodiments referring to FIG. 1, the aforesaid two sensor types shall now be described with reference to the time charts of FIG. 2 and FIG. 3.

Figure 2:
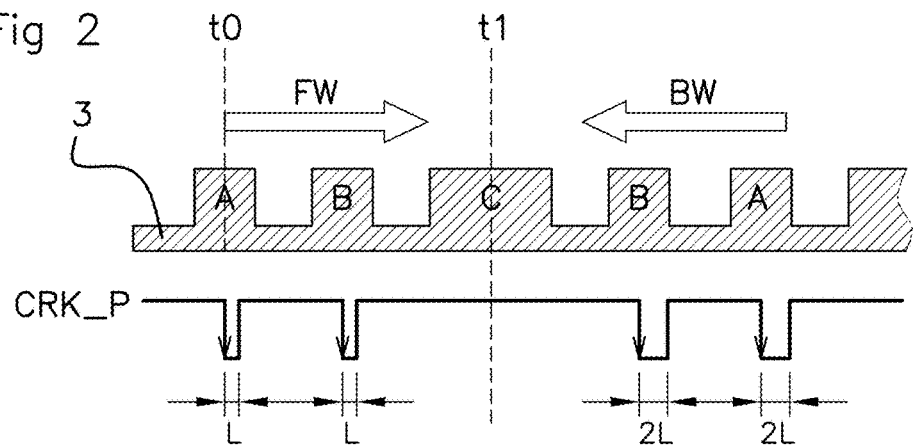
FIG. 2 shows the time function of a signal of a voltage pulse type sensor in the event of a change in the direction of rotation of the target.
Figure 3:
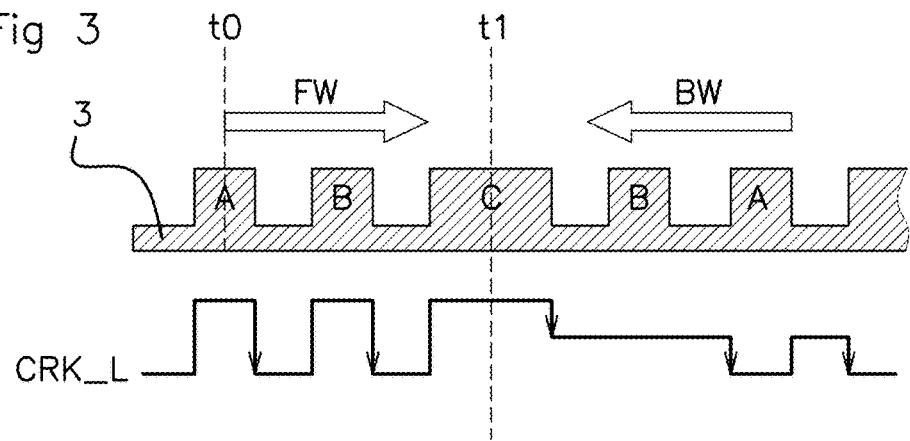
FIG. 3 shows the time function of a signal of a voltage level type sensor in the event of a change in the direction of rotation of the target.

In these FIGS. 2 and 3, a portion of the teeth of the toothed target 3 is represented schematically in a developed manner along a horizontal line, at the top. In particular, this concerns teeth A, B and C, passing in this order in front of the sensor when the target is turning in the normal direction.

By convention, in the rest of the description we shall call, as the forward (FW) direction of rotation, the direction of rotation corresponding to the direction of rotation of the engine in normal operation. The opposite direction of rotation shall be called the backward (BW) direction of rotation. In FIGS. 2 and 3, the normal or forward direction of rotation corresponds to a movement of the teeth from left to right. Conversely, the opposite or backward direction of rotation corresponds to a movement of the teeth from right to left.

Likewise by convention we shall denote as t0 the time when the center of the tooth A passes in front of the axis of detection of the rotation sensor, in the normal direction of rotation of the target, namely, the forward rotation. Moreover, we shall denote as t1 a time when the direction of rotation of the target is reversed, to pass in rotation in the opposite direction, namely backward. In the example shown, this reversal of the direction of rotation occurs when the tooth C is opposite the axis of detection of the rotation sensor.

Finally, the active edges of the signals are referenced by an arrow. In the examples shown, the active edges of the sensor signals are falling edges, which are better defined in general than rising edges, that is, more plain and clear, since they correspond to a discharging of electrical charges to ground. However, this is not limiting, and a sensor signal may have active edges which are rising edges without this modifying the principle of the invention in any way.

Referring to FIG. 2, a bidirectional sensor of voltage pulse type provides a square-wave signal CRK_P, having segments of high level, alternating with segments of low level. The signal is substantially periodic, with a period depending on the speed of rotation of the target facing the sensor. Each signal edge corresponds to the passage of the flank of a tooth in front of the sensor.

By design, the duration of the segments of low level, for example, depends on the direction of rotation of the target. This is realized with the aid of three detection cells, arranged in two pairs of detection cells. Depending on the pair of cells which is the first to see the tooth flank, the sensor can determine the direction of rotation. Accordingly, for a given speed of rotation of the target, the signal of the sensor has for example segments of high level having a first length L when the target is turning in the normal direction, or a second length, different from said first length, for example 2L, when the target is turning in the opposite direction from said normal direction. For example, the pulse length L is equal to 45 microseconds for a rotation in forward or normal direction, and the pulse length 2L is equal to 90 microseconds for a rotation in backward or opposite direction.

By comparing the duration of the pulses of the sensor signal to a determined threshold, it is thus possible for the processing electronics comprised in the microcontroller 1 to determine the direction of rotation of the target. These electronics may then count or subtract the angular increment corresponding to the toothed wheel used. For example, the threshold is equal to (L+2L)/2.

Referring to FIG. 3, a bidirectional sensor of voltage level type provides a square-wave signal CRK_L, having a first high level when the target is turning in the normal direction, or a second high level, different from said first level, when the target is turning in the opposite direction to said normal direction, and alternating each time with segments of low level. For example, the first voltage level is equal to 5 volts for a rotation in forward or normal direction, and the second voltage level is equal to 2.5 volts for a rotation in backward or opposite direction, the low level being equal to 0 volt.

By comparing the voltage level of the pulses of the sensor signal to a threshold, it is thus possible for the processing electronics comprised in the microcontroller 1 to determine the direction of rotation of the target. These electronics may then count or subtract the angular increment corresponding to the toothed wheel used. The threshold is equal to a voltage level between the first voltage level and the second voltage level, for example 3 volts.

The person skilled in the art easily understands that the processing of a sensor signal coming from a sensor of the voltage level type as illustrated in FIG. 3 differs significantly from the processing of a sensor signal coming from a sensor of the voltage pulse type as shown in FIG. 2. This is why, in theory, processing electronics designed for one type of sensor are not suitable for the other type of sensor.

Returning to FIG. 1, we shall now describe how, according to embodiments of the invention, processing electronics designed for a sensor of the voltage pulse type may nevertheless be used to process a sensor signal such as the signal CKR_L coming from a sensor of the voltage level type such as the represented sensor 2.

The processing electronics for a sensor of the voltage pulse type in FIG. 1 are substantially comprised of the software modules 20 and 30. The description of the functionalities and a sample embodiment of these electronics would go beyond the scope of the present explanation.

According to embodiments, the hardware module 10 comprises a first comparator 11 and a second comparator 12. A first input of each of these comparators receives the sensor signal CKR_L, or primary signal, coming from the sensor 2 and received at the input 14 of the microcontroller 1. A second input of the comparator 11 receives a first threshold voltage TH1, whereas a second input of the comparator 12 receives a second threshold voltage TH2. The output of the comparator 11 generates a first comparison signal COMP1, or first secondary signal, while the output of the comparator 12 generates a second comparison signal COMP2, or second secondary signal, which is moreover delayed by a delay element 13 disposed at the output of the comparator 12.

The delay element 13 is, for example, a series RC circuit introducing a delay equal to its time constant $\tau$. This time constant may be adjustable, for example, by modifying the value of the resistance R of the RC circuit. As a variant, the delay element 13 may be a delay line, for example, a succession of logic gates, such as invertors, each of them introducing an elementary delay contributing to the delay $\tau$.

The functioning of the device so implemented in the hardware module 11 is as follows.

Figure 4:
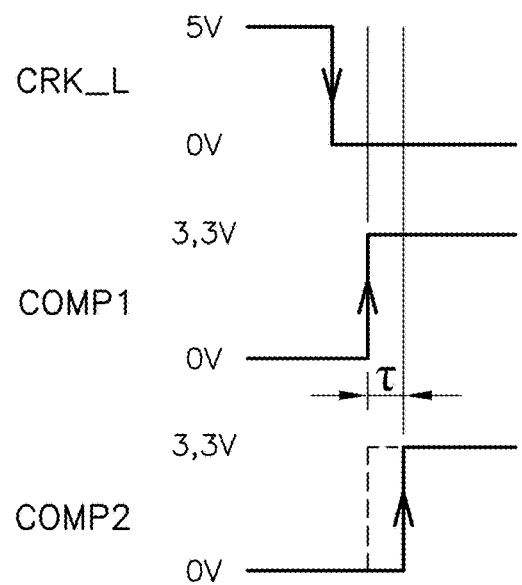
FIG. 4 shows an active edge of a primary signal coming from a bidirectional sensor of rotation of the voltage level type, an edge of a first secondary signal and an edge of a second secondary signal, each generated by the first comparator and by the second comparator of FIG. 1, respectively.

Referring to the chronograms of FIG. 4, we shall consider the primary signal constituted by the signal CKR_L produced by the sensor for detecting the rotation of the rotating target 3. Remember that this primary signal comprises pulses having, for a given speed of rotation of the target 3, a first positive voltage level, such as 5 volts, when the target 3 is turning in a first determined direction of rotation, such as the normal direction; or a second positive voltage level, different from said first voltage level, and for example equal to 2.5 volts, when the target 3 is turning in a second direction of rotation opposite said first direction of rotation. By convention, the active edges of the signal CRK_L are the falling edges, for the reasons already mentioned above.

The comparator 11 generates the first secondary signal COMP1, by comparing the primary signal CKR_L to the first determined voltage threshold TH1. This threshold TH1 is between the first positive voltage level and the second positive voltage level. In other words, the comparator 11 which generates the signal COMP1 is switched at the changes in level of the primary signal between the first positive voltage level, namely 5 V in the example, and the second positive voltage level, namely 2.5 V in the example. The threshold TH1 is for example equal to 3 volts.

Likewise, the comparator 12 generates the second secondary signal COMP2, by comparing the primary signal CKR_L to the second determined voltage threshold TH2. This threshold TH2 is between the second positive voltage level and zero voltage. In other words, the comparator 12 which generates the signal COMP2 is switched at the changes in level of the primary signal CKR_L between the second positive voltage level, namely 2.5 V in the example, and zero voltage, namely 0 V. The threshold TH2 is for example equal to 2 volts.

Moreover, the delay element 13 intentionally introduces in the second secondary signal COMP2 a determined delay $\tau$ with respect to the first secondary signal COMP1. The delay $\tau$ is such that the second secondary signal COMP2 switches always after the first secondary signal COMP1, regardless of the fluctuation ("jitter") of the signals in the hardware module 10. In a sample embodiment, the delay $\tau$ is equal to around 8 microseconds (μs), which is sufficient in practice to meet the above condition. This value remains much less than the period of the primary signal CRK_L and the secondary signals COMP1 and COMP2, which is of the order of a hundred or several hundred of milliseconds (ms) for speeds of rotation of the engine of several thousand revolutions per minute (rpm). Typically, in fact, the speed of rotation of the crankshaft of an internal combustion engine is between 30 rpm or slightly less and 7000 rpm or slightly more.

It will be noted that the active edges of the secondary signals COMP1 and COMP2 represented are rising edges. This is only one example, in the case when the comparators 11 and 12 generating these signals are inverting amplifiers. If falling edges are preferred for the active edges of the signals COMP1 and COMP2, it is sufficient to invert these signals with the aid of inverting circuits placed at the output of the comparators 11 and 12, respectively. However, this introduces a delay corresponding to the delay introduced by the inverters, which delay lengthens the time needed to detect a change in the direction of rotation of the target.

The rest of the functioning of the device shall now be described with reference to the chronograms of FIGS. 5a-5f.

Basically, this involves the comparing to a determined threshold of the duration between an active edge of the second secondary signal COMP2 and the last active edge of the first secondary signal COMP1 preceding said active edge of the second secondary signal COMP2, in order to deduce from that the direction of rotation of the target. If this duration is substantially equal to the delay τ introduced intentionally between the second secondary signal COMP2 with respect to the first secondary signal COMP1, then it is determined that the target and thus the crankshaft are turning in the normal or forward direction. If, on the contrary, this duration ΔT is much greater than the delay τ, then it is determined that the target and thus the crankshaft are turning in the opposite or backward direction.

At the top of FIGS. 5a-5b, on the one hand, and at the top of FIGS. 5c-5f on the other hand, the teeth of the target 3 passing in front of the bidirectional rotation sensor are shown schematically in a developed view along a horizontal line, at the top. This involves, in particular, the teeth Z, A, B and C. This representation adopts the same conventions as those given above with respect to FIGS. 2 and 3, so there is no need to repeat them here.

In order to explain the functioning of the device, we shall consider the different possible configurations of the target 3 when a change occurs in the direction of rotation. Thus:

at time t0 the center of the tooth A is about to pass opposite the axis of detection of the sensor, in the FW direction of normal or forward rotation of the target; the sensor thus sees the teeth B, then C, pass in front of its axis of detection in the direction FW;

at time t1 a first reversal of the direction of rotation of the target 3 occurs while the center of the tooth C is about to pass opposite the axis of detection of the sensor, in the direction FW; the rotation of the target 3 occurs, starting at time t1, in the reversed or backward BW direction of rotation of the target; the sensor then sees the teeth B, then A, then Z, once more pass in the direction BW in front of its axis of detection;

at time t2 a second reversal of the direction of rotation of the target 3 occurs while the center of the tooth Z is about to pass opposite the axis of detection of the sensor, in the direction BW; the rotation of the target 3 occurs, starting at time t2, in the FW direction of normal or forward rotation of the target; the sensor then sees the teeth A, then B, once more pass in front of its axis of detection;

at time t3 a third reversal of the direction of rotation of the target 3 occurs while the axis of detection of the rotation sensor is situated opposite a gap between the teeth B and C, the target 3 turning in the normal direction FW; the rotation of the target 3 occurs, starting at time t3, in the BW direction of reversed or backward rotation of the target; the rotation sensor thus does not see the tooth C, but instead it then sees the teeth B, then A, once more pass in front of its axis of detection in the direction BW; and finally at time t4 a fourth reversal of the direction of rotation of the target 3 occurs while the axis of detection of the rotation sensor is situated opposite a gap between the teeth A and Z, the target turning in the reversed direction BW; the rotation of the target 3 occurs, starting at time t4, in the FW direction of normal or forward rotation of the target; the rotation sensor thus sees the teeth A, then B, etc. once more pass in front of its axis of detection.

FIG. 5a shows the time function for the movement sequence of the target 3 described above and represented above in FIGS. 5a and 5b of a primary sensor signal CRK_P which would be generated by the bidirectional sensor of the voltage pulse type for which the processing electronics are designed to operate. This signal has pulses of width L or 2L, depending on the direction of rotation FW or BW, respectively, of the target 3. This has already been described above in regard to FIG. 2 and there is no need to return to it in detail here. The logical implications between the passage of the tooth flanks in front of the axis of detection of the sensor and the pulse edges of the signal CRK_P are indicated by small arrows.

FIG. 5b shows the time function of a signal ROT_DIR generated by the processing electronics from the sensor signal CRK_P of FIG. 5a. The logical implications between the width of the pulses of the signal CRK_P and the edges of the signal ROT_DIR are indicated by small arrows between FIG. 5a and FIG. 5b.

FIG. 5c, FIG. 5d, FIG. 5e show, respectively, the time function of the primary sensor signal CRK_L generated by the bidirectional rotation sensor of pulse level type 2 in FIG. 1, the first secondary sensor signal COMP1 generated by the comparator 11 of FIG. 1, and the second secondary sensor signal COMP2 generated by the comparator 12 of FIG. 1. For easier reading of the drawings, the teeth of the target 3 passing in front of the bidirectional rotation sensor are again shown schematically in a developed view along a horizontal line, at the top of these figures.

FIG. 5f shows the time function of a signal ROT_DIR generated by the processing electronics of FIG. 1 from secondary sensor signals COMP1 and COMP1 of FIG. 5d and FIG. 5e, respectively. The low or high logic state of the signal ROT_DIR indicates the rotation of the target in the normal FW direction or in the reverse direction BW, respectively.

The logic state to be taken on by the signal ROT_DIR is evaluated in response to each active edge (rising edge) of the second secondary sensor signal COMP2. This state is determined as a function of the comparison to a determined threshold of the duration ΔT between said active edge of said second secondary signal COMP2 and the last active edge of the first secondary signal COMP1 preceding said active edge of the second secondary signal COMP2. This duration is evaluated each time between the active edges of the signals COMP1 and COMP2, that is, rising edges in the example considered here and illustrated by FIGS. 5*d* and 5*e*. If this duration is substantially equal to the delay intentionally introduced between the second secondary signal COMP2 with respect to the first secondary signal COMP1, then it is determined that the target and thus the crankshaft are turning in the normal or forward direction, and the signal ROT_DIR is set or held at a corresponding logic level, such as the low level. If on the contrary this duration is much greater than the delay τ, then it is determined that the target and thus the crankshaft are turning in the reversed or backward direction, and the signal ROT_DIR is set or held at a corresponding logic level, such as the high level.

Thus, for example, between times t0 and t1 on the one hand and between times t2 and t3 on the other hand, as well as after time t4, when the target 3 is turning in the normal FW direction, the duration between the active edge of each signal pulse COMP2 and the last pulse of the signal COMP1 preceding this active edge of the signal COMP2 is substantially equal to the duration of the delay τ, introduced intentionally between these two signals. Referring once more to the diagrams of FIG. 4, this means that the signal CRK_L has crossed not only the threshold TH1 between the first high level (5 V) and the second high level (2.5 V), but also the threshold TH2 between the second high level (2.5 V) and the low level (0 V). This means, according to the definition of the signal CRK_L coming from a rotation sensor of the voltage level type and as explained in regard to FIG. 3, that the target is turning in the normal FW direction.

On the contrary, between the times t1 and t2, the duration ΔT1 between the active edge of the first pulse of the signal COMP2 and the active edge of the last pulse of the signal COMP1 preceding this edge of the signal COMP1 is greater than the duration of the delay τ. Likewise, the duration ΔT2 between the active edge of the second pulse of the signal COMP2 and the active edge of the last pulse of the signal COMP1 preceding this edge of the signal COMP1 is greater than the duration of the delay τ. Again likewise, between the times t3 and t4 the duration ΔT3 between the active edge of the pulse of the signal COMP2 and the active edge of the last pulse of the signal COMP1 preceding this edge of the signal COMP1 is significantly greater than the duration of the delay τ. In all these cases, it is thus determined by the processing electronics of the device 1 that the target and thus the crankshaft are turning in the reverse or backward BW direction. As a consequence, the signal ROT_DIR is set or held at the high logic level.

The criterion for realization of the condition "duration significantly greater than the duration of the delay τ" may be evaluated as a function of the period of the sensor signal CRK_L. In fact, if the duration ΔT is greater than the duration of the delay τ for around one period of the signal CRK_L at least, this condition may be considered to be met. As already noted above, the duration of the delay τ is substantially less than the typical values of the period of the sensor signal CRK_L, around 100 times smaller at least, depending on the speed of rotation of the engine.

The comparison step illustrated by FIG. 5*f* which results in the generating of the signal for detection of the direction of rotation ROT_DIR may advantageously be realized by software, insofar as it consists substantially in counting times. In one embodiment, the signal ROT_DIR may thus be generated in a software module of the device 1, for example, preferably in the basic software mode 20 (BSW) of the device of FIG. 1. For this purpose, the software module 20 may receive the secondary sensor signals COMP1 and COMP2. As a variant, the signal ROT DIR may also be generated in the application software module 30 (ASW). As yet another variant, it may also be generated by hardware means, for example, in the hardware module 10 of the device of FIG. 1.

It will be noted that while the signal COMP1 only serves for detection of the direction of rotation of the target, the signal COMP2 for its part carries the information comprised of nearly all of the edges of the primary sensor signal CRK_L coming directly from the sensor. This is why the angular clock signal translating the speed of rotation of the target, and serving for the synchronization of the control of the engine in the sample application described here, may be generated for example by software, starting from the second secondary signal COMP2. This signal may be used for example as a reference signal for the digital phase locked loop (DPLL) mentioned above.

Embodiments of the present invention have been described and illustrated in the present detailed description and in the figures. The present invention is not limited to the embodiments presented. Other variants and embodiments may be deduced and implemented by the person skilled in the art upon perusal of the present description and the appended figures.

For example, the toothed target may be provided with any given number N of teeth. Furthermore, the present invention has been described with toothed targets, but it may apply to any type of target, whether optical or magnetic, for example. Likewise, the signal processing may be realized indifferently on rising and/or falling edges without thereby leaving the scope of the present invention.

In the claims, the term "comprise" does not exclude other elements or other steps. A single processor or several such processing units may be used to implement the invention. The different characteristics presented and/or claimed may be advantageously combined. Their presence in the description or in the various dependent claims does not exclude this possibility. The reference symbols may not be construed as limiting the scope of the invention.

The invention claimed is:

1. A method for processing a primary signal produced by a sensor for detecting rotation of a rotating target of voltage level type, said primary signal comprised of pulses having, for a given speed of rotation of the target, a first positive voltage level when the target is turning in a first direction of rotation, and a second positive voltage level different from said first voltage level when the target is turning in a second direction of rotation opposite said first direction of rotation, the method comprising:
   generating a first secondary signal by comparing the primary signal to a first voltage threshold between the first voltage level and the second voltage level;
   generating a second secondary signal by comparing the primary signal to a second voltage threshold between the second voltage level and zero voltage;
   introducing a delay in the second secondary signal with respect to the first secondary signal;
   determining a duration between an active edge of the second secondary signal and a last active edge of the first secondary signal preceding said active edge of the second secondary signal; and
   determining the direction of rotation of the target from a result of comparing the determined duration to a time threshold.

2. The method as claimed in claim 1, further comprising:
generating an angular clock signal translating the speed of rotation of the target based on the second secondary signal.

3. The method as claimed in claim 2, wherein in said determining the direction of rotation of the target, if the duration between an active edge of the second secondary signal and the last active edge of the first secondary signal preceding said active edge of the second secondary signal is substantially equal to the time threshold, then it is determined that the target is turning in a normal direction of rotation; whereas
if on the contrary the duration between an active edge of the second secondary signal and the last active edge of the first secondary signal preceding said active edge of the second secondary signal is greater than the time threshold, then it is determined that the target is turning in a direction of rotation opposite the normal direction of rotation.

4. The method as claimed in claim 2, wherein in said determining the direction of rotation of the target comprises:
generating a signal for detection of the direction of rotation of the target having a first logic level, when it is determined that the target is turning in a normal direction of rotation; and
generating a second logic level, different from said first logic level, when it is determined that the target is turning in a direction of rotation opposite the normal direction of rotation.

5. The method as claimed in claim 2,
wherein each of the generating the first secondary signal, the generating the second secondary signal, and the introducing the delay in the second secondary signal with respect to the first secondary signal are carried out by hardware, and
wherein the determining the direction of rotation of the target, including comparing the determined duration to the time threshold, is carried out by software executed by one or more processing units.

6. An electronic device comprising means configured to implement the processing method of claim 2.

7. The method as claimed in claim 1, wherein the time threshold is substantially equal to a duration of the delay introduced in the second secondary signal with respect to the first secondary signal.

8. The method as claimed in claim 7, wherein in said determining the direction of rotation of the target,
if the duration between an active edge of the second secondary signal and the last active edge of the first secondary signal preceding said active edge of the second secondary signal is substantially equal to the time threshold, then it is determined that the target is turning in a normal direction of rotation; whereas
if on the contrary the duration between an active edge of the second secondary signal and the last active edge of the first secondary signal preceding said active edge of the second secondary signal is greater than the time threshold, then it is determined that the target is turning in a direction of rotation opposite the normal direction of rotation.

9. The method as claimed in claim 7, wherein in said determining the direction of rotation of the target comprises:
generating a signal for detection of the direction of rotation of the target having a first logic level, when it is determined that the target is turning in a normal direction of rotation; and
generating a second logic level, different from said first logic level, when it is determined that the target is turning in a direction of rotation opposite the normal direction of rotation.

10. The method as claimed in claim 7,
wherein each of the generating the first secondary signal, the generating the second secondary signal, and the introducing the delay in the second secondary signal with respect to the first secondary signal are carried out by hardware, and
wherein the determining the direction of rotation of the target, including comparing the determined duration to the time threshold, is carried out by software executed by one or more processing units.

11. An electronic device comprising means configured to implement the processing method of claim 7.

12. The method as claimed in claim 1, wherein in said determining the direction of rotation of the target,
if the duration between an active edge of the second secondary signal and the last active edge of the first secondary signal preceding said active edge of the second secondary signal is substantially equal to the time threshold, then it is determined that the target is turning in a normal direction of rotation; whereas
if on the contrary the duration between an active edge of the second secondary signal and the last active edge of the first secondary signal preceding said active edge of the second secondary signal is greater than the time threshold, then it is determined that the target is turning in a direction of rotation opposite the normal direction of rotation.

13. The method as claimed in claim 12, wherein in said determining the direction of rotation of the target comprises:
generating a signal for detection of the direction of rotation of the target having a first logic level, when it is determined that the target is turning in a normal direction of rotation; and
generating a second logic level, different from said first logic level, when it is determined that the target is turning in a direction of rotation opposite the normal direction of rotation.

14. The method as claimed in claim 12,
wherein each of the generating the first secondary signal, the generating the second secondary signal, and the introducing the delay in the second secondary signal with respect to the first secondary signal are carried out by hardware, and
wherein the determining the direction of rotation of the target, including comparing the determined duration to the time threshold, is carried out by software executed by one or more processing units.

15. The method as claimed in claim 1, wherein in said determining the direction of rotation of the target comprises:
generating a signal for detection of the direction of rotation of the target having a first logic level, when it is determined that the target is turning in a normal direction of rotation; and
generating a second logic level, different from said first logic level, when it is determined that the target is turning in a direction of rotation opposite the normal direction of rotation.

16. The method as claimed in claim 15,
wherein each of the generating the first secondary signal, the generating the second secondary signal, and the introducing the delay in the second secondary signal with respect to the first secondary signal are carried out by hardware, and wherein the determining the direction of rotation of the target, including comparing the determined duration to the time threshold, is carried out by software executed by one or more processing units.

17. The method as claimed in claim 1,
wherein each of the generating the first secondary signal, the generating the second secondary signal, and the introducing the delay in the second secondary signal with respect to the first secondary signal are carried out by hardware, and
wherein the determining the direction of rotation of the target, including comparing the determined duration to the time threshold, is carried out by software executed by one or more processing units.

18. An electronic device comprising means configured to implement the processing method of claim 1.

19. A system for management of an internal combustion engine, comprising at least one rotating target integrated in rotation with one of a crankshaft and a camshaft of the engine, a bidirectional sensor of the voltage level type, and the electronic device as claimed in claim 18.

20. The method as claimed in claim 1, wherein the time threshold is substantially equal to a duration of the delay introduced in the second secondary signal with respect to the first secondary signal.

* * * * *